United States Patent
Schmidtlein et al.

(10) Patent No.: US 8,786,294 B2
(45) Date of Patent: Jul. 22, 2014

(54) METHOD FOR MONITORING THE ELECTRICAL PROPERTIES OF A LOAD CIRCUIT CONTROLLED IN A CLOCKED MANNER AND CIRCUIT SYSTEM FOR PERFORMING THE METHOD

(75) Inventors: Andreas Schmidtlein, Tamm (DE); Rainer Baumgaertner, Pfaffenhofen (DE)

(73) Assignee: Robert Bosch GmbH, Stuttgart (DE)

( * ) Notice: Subject to any disclaimer, the term of this patent is extended or adjusted under 35 U.S.C. 154(b) by 220 days.

(21) Appl. No.: 13/254,238

(22) PCT Filed: Mar. 8, 2010

(86) PCT No.: PCT/EP2010/052876
§ 371 (c)(1),
(2), (4) Date: Nov. 10, 2011

(87) PCT Pub. No.: WO2010/102965
PCT Pub. Date: Sep. 16, 2010

(65) Prior Publication Data
US 2012/0249166 A1    Oct. 4, 2012

(30) Foreign Application Priority Data
Mar. 9, 2009    (DE) .......................... 10 2009 001 400

(51) Int. Cl.
*G01R 31/00*    (2006.01)
*G05F 1/10*    (2006.01)
*H03L 7/06*    (2006.01)
*G01R 27/14*    (2006.01)
*G01R 27/26*    (2006.01)

(52) U.S. Cl.
CPC .................................... *G01R 27/14* (2013.01); *G01R 27/2611* (2013.01)
USPC ............ 324/654; 324/504; 323/234; 327/156

(58) Field of Classification Search
CPC ........................... G01R 27/14; G01R 27/2611
USPC ..................... 324/654, 504; 702/57; 323/234; 327/156
See application file for complete search history.

(56) References Cited

FOREIGN PATENT DOCUMENTS

DE    198 31 381    1/1999
DE    10 2005 034859    2/2007
(Continued)

OTHER PUBLICATIONS

Hoffman; (EP 1384976 A1) Method of position determination for an inductive position sensor, Jan. 28, 2004.*

(Continued)

*Primary Examiner* — Jermele M Hollington
*Assistant Examiner* — Farhana Hoque
(74) *Attorney, Agent, or Firm* — Kenyon & Kenyon LLP

(57) ABSTRACT

A method and a circuit system for monitoring the electrical properties of a load circuit controlled in a clocked manner, the load circuit having at least one ohmic component and at least one inductive component, having the following steps: establishing at least one first control signal and one second control signal, the control signals being established in such a way that, in the case of activation of the load circuit using the first control signal, the inductive behavior of the load circuit predominates and, in the case of activation of the load circuit using the second control signal, the ohmic behavior of the load circuit predominates, acquiring at least one measured variable, which is a function of the control signal and the ohmic and/or inductive components, in the case of activation of the load circuit using the first control signal and in the case of activation of the load circuit using the second control signal, ascertaining the deviations of the measured variables from measured variables which are expected on the basis of the nominal values of the inductive and ohmic components, classifying the state of the load circuit on the basis of the ascertained deviations.

14 Claims, 3 Drawing Sheets

(56) References Cited

FOREIGN PATENT DOCUMENTS

| | | |
|---|---|---|
| DE | 10 2008 040931 | 2/2010 |
| EP | 1 384 976 | 1/2004 |
| WO | WO 93/11369 | 6/1993 |
| WO | WO 93/12437 | 6/1993 |
| WO | WO 01/14897 | 3/2001 |

OTHER PUBLICATIONS

International Search Report, PCT International Patent Application No. PCT/EP2010/052876, dated Jul. 23, 2010.

P. Goossens, "Low-cost Inductance Meter", *Elektor*, vol. 29, No. 323, Jul. 1, 2003, pp. 58-59.

\* cited by examiner

METHOD FOR MONITORING THE ELECTRICAL PROPERTIES OF A LOAD CIRCUIT CONTROLLED IN A CLOCKED MANNER AND CIRCUIT SYSTEM FOR PERFORMING THE METHOD

FIELD OF THE INVENTION

The present invention relates to a method for monitoring the electrical properties of a load circuit controlled in a clocked manner and a circuit system for performing the method.

BACKGROUND INFORMATION

In load circuits which are controlled in a clocked manner, it is typically necessary to monitor the individual circuit components with respect to their electrical properties and therefore their operating capability. It is typical to monitor the individual components, such as a switch or a load component, separately from one another. This type of method has the result that only partial aspects of the electrical properties of the entire load circuit may be observed in each case, and therefore monitoring of the electrical properties and error analysis of the entire load circuit based thereon are not possible or are at least very complex.

SUMMARY

In accordance with the present invention, a method is provided for monitoring the electrical properties of a load circuit controlled in a clocked manner, the load circuit having at least one ohmic component and at least one inductive component, the method has the following steps: establishing at least one first control signal and one second control signal, the control signals being established in such a way that, in the case of activation of the load circuit using the first control signal, the inductive behavior of the load circuit predominates and, in the case of activation of the load circuit using the second control signal, the ohmic behavior of the load circuit predominates, acquiring at least one measured variable, which is a function of the control signal and the ohmic and/or inductive components, in the case of activation of the load circuit using the first control signal and in the case of activation of the load circuit using the second control signal, ascertaining the deviations of the measured variables from measured variables which are expected on the basis of the nominal values of the inductive and ohmic components, and classifying the state of the load circuit on the basis of the ascertained deviations.

The example method and the example circuit system according to the present invention have the advantage that the ohmic and/or inductive properties of the entire load circuit may be completely analyzed and therefore a very reliable statement may be made about the operating capability of the entire load circuit and optionally about the error source.

An integrative measuring method is preferably used for acquiring the measured variables, as is described in German Patent Application DE 10 2008 04 09 31. In particular in the case of very short pulse durations of the control signal, this measuring method provides very precise results.

Furthermore, it is advantageous if the example method according to the present invention is used both for the initial test before the load circuit is put into operation and also for monitoring the load circuit in running operation.

According to an advantageous specific embodiment of the present invention, the control signals are established in such a way that a mechanical activation of the load circuit is prevented. This could not be ensured in the conventional case because of the length of the control pulses required for this purpose, so that an undesired activation of the load components frequently occurred, i.e., for example, startup of an electric motor or opening/closing of a valve.

Further features and advantages of specific embodiments of the present invention result from the description below with reference to the figures.

DETAILED DESCRIPTION OF EXAMPLE EMBODIMENTS

Figure 1:
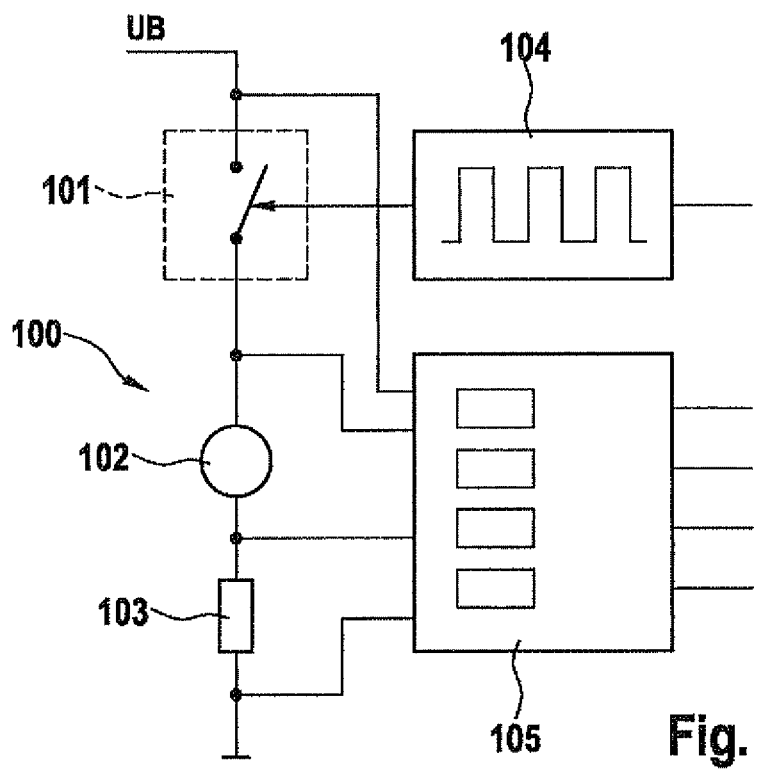
FIG. 1 shows a schematic view of a circuit system for performing the example method according to the present invention.

FIG. 1 shows the main elements of a load circuit, on which the example method according to the present invention is usable, and a measuring unit for performing the example method according to the present invention. Load circuit 100 includes a series circuit of a controllable switch 101, an inductive load 102, and a measuring arrangement 103, in the simplest case in the form of an ohmic resistor (shunt resistor). A terminal of switch 101 is connected to a supply voltage UB. A terminal of measuring arrangement 103 is connected to ground. Measuring arrangement 103 is shown as an ohmic resistor, but may also be implemented by a printed conductor section having a known resistance value. A clocked, pulse-width-modulated control signal is applied to switch 101 by a control unit 104 and is used to control the current flow through load circuit 100 and therefore also through inductive load 102. A measuring unit 105 may acquire one or more measured variables, which are a function of the control signal and the ohmic and inductive components of load circuit 100. Measured variables may be, for example, the current in measuring arrangement 103, the voltage at load 102, the voltage drop at switch 101, and/or supply voltage UB.

Such load circuits 100 appear, for example, for the control of a solenoid valve. Switch 101 is typically implemented as a semiconductor switch, inductive load 102 as a solenoid coil for controlling the solenoid valve, and measuring arrangement 103 as a precision resistor. Such load circuits are also used in the control of DC motors. Switch 101 is designed as a semiconductor switch, for example. The DC motor, which is used to drive a hydraulic pump, for example, represents load 102, and a printed conductor section having known resistance is used as measuring arrangement 103.

An example method according to the present invention is described hereafter as an example on the basis of the current in measuring arrangement 103 as the measured variable, but may also be applied similarly for all other measured variables which are a function of the control signal and the ohmic and inductive properties of the load circuit.

Figure 2:
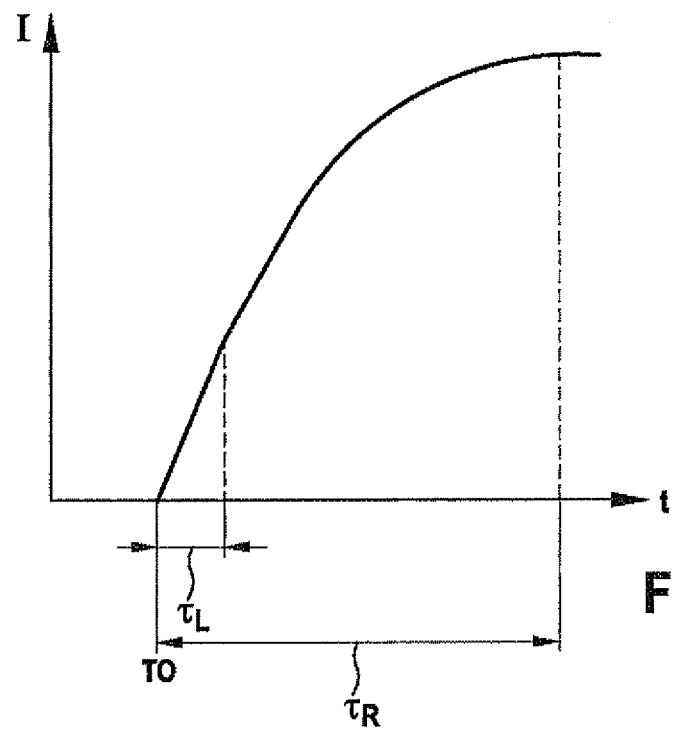
FIG. 2 shows the curve of a measured variable as a function of time.

FIG. 2 schematically shows a typical curve of the current in a load circuit, which exclusively includes an inductor L and an ohmic resistor R. After turning-on time T0, current initially increases with a delay, which is to be attributed to inductor L, to finally reach a saturation value, which is determined by the value of ohmic resistor R. Therefore, the inductive behavior of the load circuit predominates in the case of control pulses having short pulse duration $\tau_L$, while in contrast the ohmic behavior of the load circuit predominates in the case of control pulses having longer pulse duration $\tau_R$.

Figure 5:
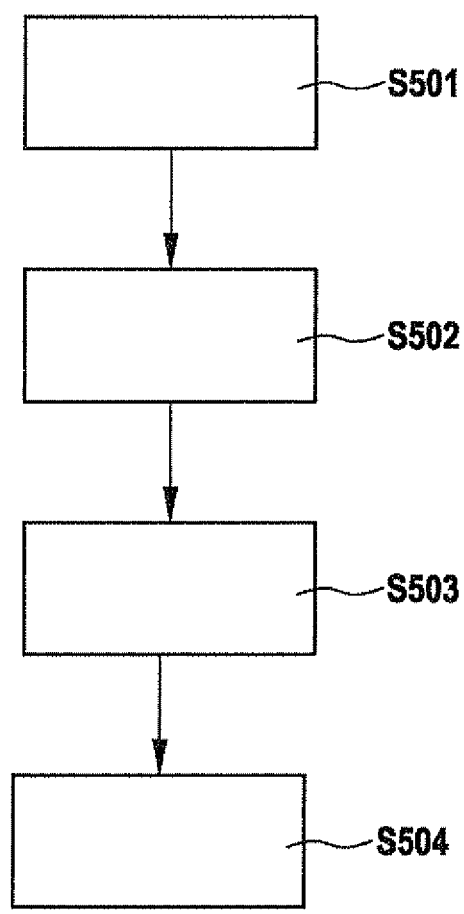
FIG. 5 shows a schematic view of the sequence of the method according to the present invention.

According to the present invention, at least two control signals are established to monitor the electrical properties of load circuit 100 in a step S 501 (cf. FIG. 5) in such a way that a first control signal has a frequency and a duty cycle such that the current flow in load circuit 100 is characterized by the inductive component of load circuit 100, and a second control signal has a frequency and a duty cycle such that the current flow in load circuit 100 is characterized by the ohmic component of load circuit 100. Frequency and duty cycle are established as a function of the nominal values of the individual components of load circuit 100.

The control signals may also be established in such a way that a mechanical activation of load circuit 100 is prevented, which is desirable in many applications. Thus, for example, when checking a load circuit having an electric motor as a load component, undesired startup of the motor is absolutely to be prevented. Undesired opening or closing of a solenoid valve as a result of a check is also undesirable.

The measurement of dependent measured variables in load circuits controlled in a clocked manner using short activation pulses is difficult and complex in particular. Therefore, an integrative measuring method, as is described in German Patent Application No. DE 10 2008 04 09 31, is advantageously used to acquire the measured variables in a step S 502 (cf. FIG. 5).

The example method according to the present invention is described hereafter on the basis of the integrative measuring method, but may also be applied similarly in the case of direct measurement of the measured variables.

Figure 3:
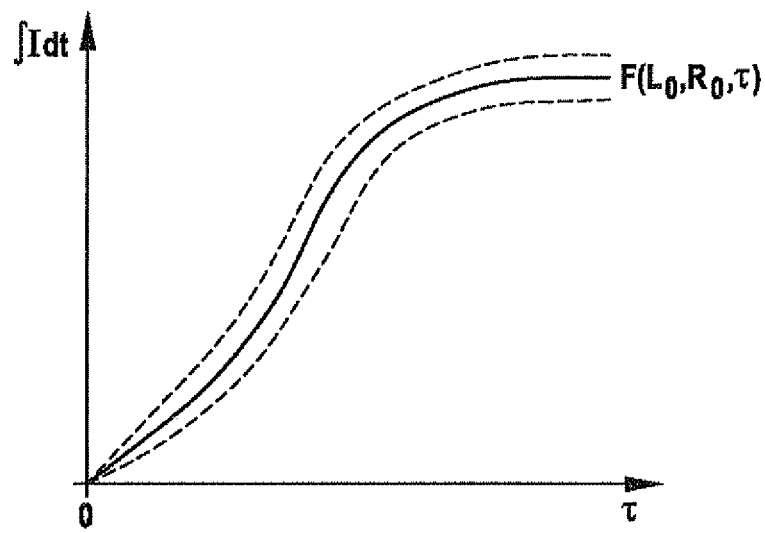
FIG. 3 shows the curve of a measured variable as a function of the pulse duration.

Both the inductive component and also the ohmic component of load circuit 100 have so-called nominal values $L_0$ or $R_0$. If one presumes a uniform voltage, current integral $\int Idt$ results over the current in measuring arrangement 103 as a function F of nominal value $L_0$ of the inductive component of load circuit 100, nominal value $R_0$ of the ohmic component of load circuit 100, and pulse duration $\tau$ of the control signal. A setpoint curve of the current integral may thus be ascertained (FIG. 3). A tolerance range, within which the value of current integral $\int Idt$ of a functioning load circuit 100 may vary, results around the setpoint curve because of the properties of the electrical components used and environmental conditions, such as the temperature. If the measured variables are outside this tolerance range, load circuit 100 is to be classified as nonfunctional or only having restricted functionality.

If the two control signals are established as provided according to the present invention in such a way that the inductive behavior of load circuit 100 predominates for the first control signal and the ohmic behavior of the load circuit predominates for the second control signal, the curve of current integral $\int Idt$ may also be split into two partial areas as a function of pulse duration $\tau$.

Figure 4:
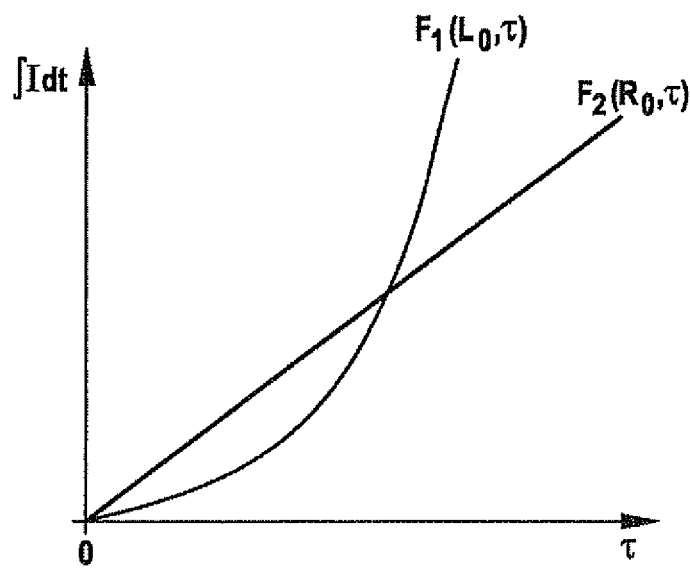
FIG. 4 shows the curve of measured variables as a function of the pulse duration and the ohmic and inductive properties.

A first current integral for a solely inductive load circuit is shown in FIG. 4. If one again presumes a uniform voltage, first current integral $\int Idt$ results as function F1 ($L_0$, $\tau$), which is only still a function of nominal value $L_0$ of the inductive component of the load circuit and pulse duration $\tau$ of the control signal. In addition, a second current integral for a solely ohmic load circuit is shown, which, under the presumption of a constant voltage, is only a function of nominal value $R_0$ of the ohmic component of the load circuit and pulse duration $\tau$ of the control signal as function F2 ($R_0$, $\tau$). These setpoint curves of the measured variable, which are based on the nominal values of the inductive and ohmic components of the load circuit, are finally used for classification. Of course, tolerance ranges (not shown here), in which the measured variables of a functional load circuit 100 may vary, also result for these setpoint curves because of the properties of the electrical components used and environmental influences, such as the temperature. However, if the measured values are outside this tolerance range, load circuit 100 is to be classified as nonfunctional or only having restricted functionality.

For the classification, the deviations of the measured variables from the setpoint curves, which are ascertained on the basis of the nominal values of the components, are first ascertained in a step S 503 (cf. FIG. 5), i.e., on the one hand, a deviation of the first measured variable from first current integral $\int Idt=F1$ ($L_0$, $\tau$) and, on the other hand, a deviation of the second measured variable from second current integral $\int Idt=F2$ ($R_0$, $\tau$). As a function of these deviations, the operating capability and advantageously optionally also the error source are subsequently classified in a step S 504 (cf. FIG. 5).

This classification may be implemented, for example, by a classification table, a decision matrix, a characteristics map, or also a decision tree. Depending on the degree of detail of the table, the matrix, the characteristics map, or the tree, a very detailed error diagnosis is thus also possible. For example, if the measured current integral deviates significantly from the nominal current integral of inductor $L_0$ to be expected in the inductively characterized area, this indicates a coil short-circuit in inductive load 102 (for example, motor short-circuit or valve coil short-circuit). In contrast, if the measured current integral deviates significantly from the nominal current integral of resistor $R_0$ to be expected in the area of the ohmic characterization, this may indicate a short in switch 101. However, the example method according to the present invention offers special advantages in the case of the combination of deviations of both the expected inductive behavior and the expected ohmic behavior. In this way, errors which are not detectable by analyzing a single measured variable may also be recognized. Thus, for example, a relatively high-resistance shunt of an inductive load 102, for example, of a DC motor, results in dropping of the ohmic resistance, on the one hand, but also dropping of the inductance, on the other hand. It is only possible to recognize such an error through the simultaneous observation and analysis of both deviations from the expected nominal value.

The example method according to the present invention may be used both as an initial test before load circuit 100 is put into operation and also as a permanent monitor of load circuit 100 in running operation.

For an initial test, the first control signal is advantageously established as a signal having a relatively high frequency and relatively short pulse duration. The second control signal is established as a signal having a relatively low frequency, but a greater, preferably moderate pulse length.

For permanent monitoring of load circuits 100 in running operation, in contrast, the frequency of the control signal is advantageously changed cyclically with a uniform duty cycle.

What is claimed is:

1. A method for monitoring electrical properties of a load circuit controlled in a clocked manner, the load circuit having at least one ohmic component and at least one inductive component, the method comprising:

establishing at least one first control signal and one second control signal, the first control signal and the second control signal being established in such a way that, in a case of activation of the load circuit using the first control signal, an inductive behavior of the load circuit predominates, and, in a case of activation of the load circuit using the second control signal, an ohmic behavior of the load circuit predominates;

acquiring at least one first measured variable and at least one second measure variable of the load circuit, which are a function of a control signal and at least one of the ohmic and inductive components, in the case of activation of the load circuit using the first control signal and in the case of activation of the load circuit using the second control signal, respectively;

ascertaining deviations of the first and second measured variables from measured variables which are expected for a resistor load circuit and for an inductor load circuit, respectively, on a basis of nominal values of the ohmic and inductive ohmic components; and classifying a state of the load circuit based on the ascertained deviations.

2. The method as recited in claim 1, wherein at least one of the first control signal and the second control signal includes at least two control pulses.

3. The method as recited in one of claim 1, wherein an integrative measuring method is used to acquire the measured variables.

4. The method as recited in claim 3, wherein load is one of a DC motor or a solenoid coil of a solenoid valve.

5. The method as recited in claim 1, wherein the load circuit has at least one switch and one inductive load.

6. The method as recited in one of claim 5, wherein at least one of a voltage drop at the switch, a voltage drop at the inductive load, and a supply voltage is used as the measured variable.

7. The method as recited in one of claim 5, wherein the load circuit has a measuring arrangement and a current in the measuring arrangement is used as the measured variable.

8. The method as recited in claim 1, wherein the first control signal and the second control signal are established in such a way that undesired mechanical activation of the load circuit is prevented.

9. The method as recited in claim 1, wherein the method is performed as an initial test before the load circuit is put into operation.

10. The method as recited in claim 9, wherein the first control signal and the second control signal are established in such a way that a frequency of the first control signal is higher than a frequency of the second control signal, and a pulse duration of the first control signal is less than a pulse duration of the second control signal.

11. The method as recited in claim 1, wherein the method is performed in running operation of the load circuit.

12. The method as recited in claim 11, wherein the first control signal and the second control signal are established in such a way that a frequency of the first control signal and the second control signal is changed cyclically with a uniform duty cycle.

13. A circuit system for monitoring electrical properties of a load circuit controlled in a clocked manner, the load circuit including at least one switch and at least one inductive load, the circuit system comprising:

a control unit to control the switch; and a measuring unit for acquiring and analyzing measured variables;

wherein the circuit system is configured to perform a monitoring method, the monitoring method including the steps of:

establishing at least one first control signal and one second control signal, the first control signal and the second control signal being established in such a way that, in a case of activation of the load circuit using the first control signal, an inductive behavior of the load circuit predominates, and, in a case of activation of the load circuit using the second control signal, an ohmic behavior of the load circuit predominates;

acquiring at least one first measured variable and at least one second measured variable, which are a function of a control signal and at least one of the ohmic and inductive components, in the case of activation of the load circuit using the first control signal and in the case of activation of the load circuit using the second control signal, respectively;

ascertaining deviations of the first and second measured variables from measured variables which are expected for a resistor load circuit and for an inductor load circuit, respectively, on a basis of nominal values of the ohmic and inductive ohmic components; and classifying a state of the load circuit based on the ascertained deviations.

14. A method for monitoring electrical properties of a load circuit controlled in a clocked manner, the load circuit having at least one ohmic component and at least one inductive component, the method comprising:

establishing at least one first control signal and one second control signal, the control signals being established in such a way that, in the case of activation of the load circuit using the first control signal, an inductive behavior of the load circuit predominates, and, in the case of activation of the load circuit using the second control signal, an ohmic behavior of the load circuit predominates, at least one of the control signals including at least two control pulses;

acquiring at least one measured variable, which is a function of the respective control signal and at least one of the ohmic and inductive components, in the case of activation of the load circuit using the first control signal and in the case of activation of the load circuit using the second control signal;

ascertaining the deviations of the measured variables from measured variables which are expected on the basis of nominal values of the inductive and ohmic components; and classifying a state of the load circuit on the basis of the ascertained deviations.

* * * * *